United States Patent [19]
Suzuki et al.

[11] 3,988,066
[45] Oct. 26, 1976

[54] LIGHT EXPOSURE APPARATUS FOR PRINTING

[75] Inventors: Akiyoshi Suzuki, Tokyo; Ichiro Kano, Yokohama, both of Japan

[73] Assignee: Canon Kabushiki Kaisha, Japan

[22] Filed: Dec. 30, 1974

[21] Appl. No.: 537,323

[30] Foreign Application Priority Data
Jan. 12, 1974    Japan.................................. 49-6908

[52] U.S. Cl. ................................ 355/78; 350/167; 355/71
[51] Int. Cl.² .................... G03B 27/02; G02B 27/00
[58] Field of Search .................... 355/18, 37, 46, 54, 355/67, 70, 71, 78, 132; 350/167

[56] References Cited
UNITED STATES PATENTS

| | | | |
|---|---|---|---|
| 3,532,038 | 10/1970 | Rottmann | 355/46 X |
| 3,584,948 | 6/1971 | Herriott | 355/46 X |
| 3,594,081 | 7/1971 | Tschink | 355/67 |
| 3,941,475 | 3/1976 | Sheets | 350/167 X |

*Primary Examiner*—Richard A. Wintercorn
*Attorney, Agent, or Firm*—McGlew and Tuttle

[57] ABSTRACT

In the apparatus, an image of a mask is printed on a light-sensitive layer while minimizing the debasing influences due to the diffraction occurring on the layer surface as well as due to the standing wave occurring in the layer. This apparatus includes an arrangement such that the rays coming from a light source are collimated and then directed to a fly's eye lens assembly, and the exit rays from this assembly are again collimated to illuminate the mask. The luminous fluxes of parallel rays impinging upon the mask at various angles of incidence remove the influences of diffraction on the image of the mask. Also this apparatus includes a filter removably inserted in the optical path between the light source and the assembly to remove the influence of the standing wave.

15 Claims, 15 Drawing Figures

BASE

LIGHT EXPOSURE APPARATUS FOR PRINTING

BACKGROUND OF THE INVENTION

This invention relates to an apparatus for exposing a photosensitive layer through a photomask carrying microscopic patterns, such as of an integrated circuit, and more particularly to a light exposure apparatus suitable for use in photolithographically printing a micro-circuit on a semiconductor substrate.

The exposure of a photosensitive layer such as a photoresist layer applied on a substrate is associated with two objectionable problems of damaging the printed image, one of which is caused by the diffraction of light, and another of which is due to the standing wave occurring in the photosensitive layer.

Conventionally, it has been known that negative films carrying microscopic patterns, when printed by the contact-printing method, provide no perfectly reproduced patterns because of the influence of diffraction which appears in a phenomenon as arising from the insufficient contact between the negative film and the photosensitive layer. This phenomenon is serious in the non-contact printing method which has been developed to prevent damage of the photomask as well as of the wafer which will be caused each time when the photomask is brought into intimate contact with the photosensitive layer applied on the wafer. An apparatus which has overcome this drawback by utilizing the physical phenomenon that one diffraction pattern can be cancelled by superposition of another diffraction pattern known in German laid open for inspection application 2,140,549.

On the other hand, when the light flux impinging upon the wafer is of a monochromatic light, the standing (stationary) waves are caused to appear in the photosensitive layer applied on the wafer surface, resulting in formation of wrinkles on the hardened portions of the developed and processed photosensitive layer of the wafer. In order to overcome this drawback, it is desirable to provide a light-permeable layer of a specified thickness and having an index of refraction almost equal to that of the photosensitive layer located between the photosensitive layer and the wafer and to expose this photosensitive layer to a light flux containing many different wavelength rays.

SUMMARY OF THE INVENTION

An object of the invention is to provide a light exposure apparatus for printing in which the number of diffraction patterns (fringes) which are capable, upon superposition, of cancelling one another is increased to produce an integrative effect on elimination of the diffraction patterns, whereby the shape of the improved pattern is made more smooth.

Another object of the present invention is to provide a light exposure apparatus having provision for varying the inclination angles of illumination light fluxes impinging upon the photomask in accordance with the line width of the microscopic pattern carried on the photomask.

Still another object of the invention is to provide a light exposure apparatus of the character described which is constructed so as to facilitate the incorporation of the optical means for compensating the standing wave.

The term "integrative effect" herein used refers to an infinite superposition of diffraction patterns which is effected by continuous distribution of incident angles of the rays impinging upon the photomask. However, in the practical case, it is difficult to make a light flux of rays with continuously varying angles of incidence. Accordingly, in one embodiment of the invention as shown in FIG. 2, such integrative effect is approximated by a finite superposition of diffraction patterns which is effected by use of a light flux of rays with discontinuously distributed angles of incidence.

Further, it is desirable to vary the inclination angles at which the rays impinge upon the photomask in accordance with the average width of the lines constituting the microscopic pattern and with the distance between the photomask and the photosensitive layer. To achieve this, the present invention contemplates the use of an iris diaphragm or a diaphragm plate having a number of openings of different diameter for varying the size of aperture of the apparatus with variation in the maximum inclination angle.

The optical means for compensating the standing wave will be described later in connection with a specific example of the embodiment.

DESCRIPTION OF THE PREFERRED EMBODIMENT

Figure 1:
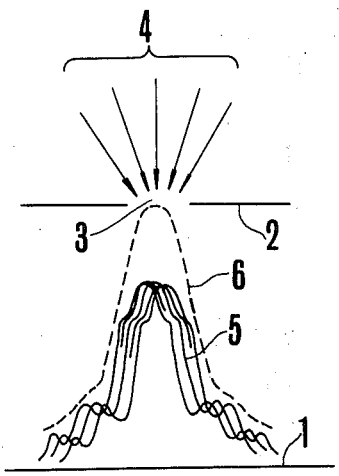
FIG. 1 is a schematic representation showing the principle of the invention.

FIG. 1 shows the action of the apparatus of the invention, wherein 1 is the surface of a photosensitive layer, 2 is a photomask having a transparent region 3 formed therein serving as a slit for a light flux of rays 4. A continuity of slit 3 forms a micro-circuit. The interval between surface 1 and mask 2 is in the range of 6 microns to 30 microns, and the width of the slit 2 is about 1.5 microns to 6 microns. The illumination light flux 4 is composed of rays with respective different inclination angles with respect to the normal line of the photomask 3. 5 is a diffraction pattern produced with collimated rays passing through the slit 3 at right angles with respect to the plane of the photomask 2. For rays passing through the slit 3 at angles deviated from the right angle by discrete degrees, a number of patterns of similar profile to that of pattern 5 are produced in respective positions displaced from one another by slight discrete distances, so that the superposition of these patterns provides a pattern 6. It is to be understood that the quality of image of the photomask projected on the photosensitive layer is mainly deteriorated by the secondary maxima of each of the diffraction patterns.

Figure 2:
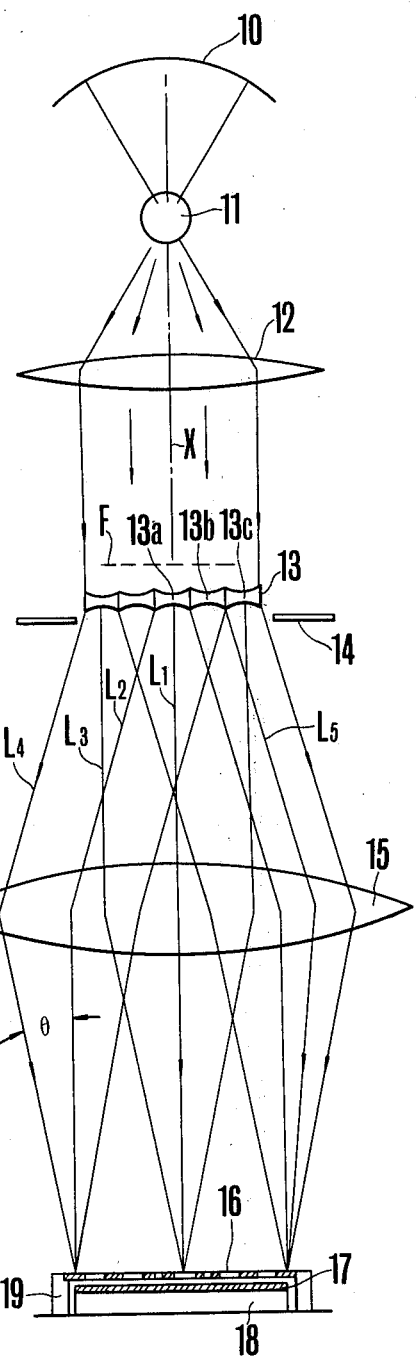
FIG. 2 is a schematic sectional view of a preferred embodiment of a light exposure apparatus for printing according to the present invention.

As shown in FIG. 2, a schematic example of an optical system for producing an illumination light flux 4 of FIG. 1 constructed according to the present invention comprises a spherical concave mirror 10, a light source 11, positioned at the center of curvature of mirror 10, a first condenser 12 positioned on the side of light source 11 opposite to mirror 10 to collimate the rays coming from the light source 11, and a fly's eye lens assembly 13 positioned in the path of the collimated rays from the condenser lens 12.

Figure 3:
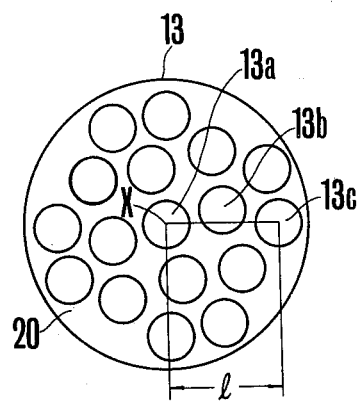
FIG. 3 is a top view of a fly's eye lens assembly usuable in the apparatus of FIG. 2.
Figure 4:
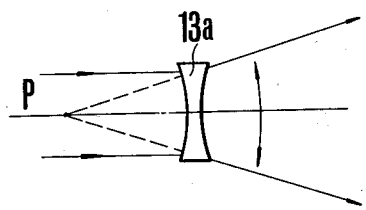
FIGS. 4 and 5 are enlarged sectional views of each lens element of the fly's eye lenses assembly of FIG. 3.
Figure 5:
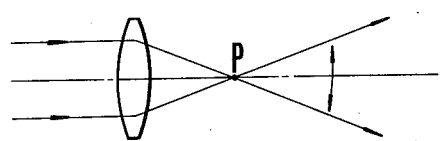

The detailed structure of the fly's eye lens assembly 13 is illustrated in FIG. 3, and each of the lens elements 13a, 13b, 13c, ... is a negative lens having a short focal length as shown in FIG. 4. A number of lens elements of identical dimension are sandwiched between a pair of metal plates 20 having openings of a diameter slightly smaller than that of each lens element in alignment with each other together with not shown spacers. It is preferred to increase the number of lens elements in a single assembly 13 and to arrange them in as close relation to each other as possible. In a practical case, however, this number may be a compromise with the various manufacturing factors. The fly's eye lens assembly 13 is disposed in the apparatus of FIG. 2 with the lens element 13a being coaxially aligned with the optical axis of the apparatus and with the other lens elements 13b and 13c being radially spaced therefrom. The dashed line F indicate a focal plane containing the virtual focal points or origins of the lens elements. Instead of using the negative lenses as the lens elements of the assembly 13, positive lens elements as shown in FIG. 5 may be used. In this case, the focal plane containing the real focal points of the positive lens elements is formed below the assembly 13.

The apparatus further includes a second condenser lens 15 arranged in coaxial alignment with the optical axis of the apparatus with the focal point of the condenser lens 15 being at the focal plane F to collimate the rays from the assembly 13 onto a photomask 16 positioned in the position corresponding to the entrance pupil of the second condenser lens 15. Positioned behind the photomask 16 is a photoresist layer 17 applied on a semiconductor wafer 18. A predetermined spaced apart relationship between mask 16 and photoresist layer 17 is firmly established by mask support means 19.

The action of the apparatus of FIG. 2 will next be explained. The rays emanating from the light source 11 are deflected in passing through the first condenser lens 12, becoming rays parallel to one another and to the optical axis thereof. Therefore, it is important to increase the efficiency of the light energy of light source 11 by use of the condenser lens 12. Next, a light flux of parallel rays enters the fly's eye lens assembly 13 which divides it into many component fluxes while causing each component flux to diverge. The component flux from the central lens element 13a includes a central ray $L_1$ and marginal ray $L_2$ which, after having passed through the second condenser lens 15, become parallel to each other and enter the mask 16 at right angles thereto. The lens element 13c arranged in the near field of the circumference of assembly 13 provides a component flux including a central ray $L_3$ and a marginal ray $L_4$ which after having passed through the second condenser lens 15 become parallel to each other, entering the mask 16 at inclination angles of $\theta$ with respect to the normal line of the mask 16. A marginal ray $L_5$ exiting from the lens element 14b enters the mask 16 at an inclination angle smaller than that of the marginal ray $L_4$ exiting from the lens element 13c. It is to be understood from the foregoing consideration that the maximum inclination angle $\theta$ available in the apparatus depends upon the distance $l$ between the axis of the lens element 13c and the axis X of the assembly 13 as shown in FIG. 3. Therefore, when a diaphragm device 14 positioned adjacent the assembly 13 is operated to decrease the size of aperture of the apparatus, the maximum inclination angle $\theta$ is decreased.

With the apparatus of FIG. 2, the mask is exposed to a number of oncoming waves equal to the number of lens elements in the fly's eye lens assembly 13. In order that these waves are effectively superimposed on the mask, it is necessary to prevent occurrence of vignetting in the light flux between the fly's eye lenses assembly and the mask. The mask has to be disposed in coincidence with the entrance pupil of the second condenser lens. The fly's eye lens assembly is designed to have a diameter determined in accordance with the maximum inclination angle for the rays necessary for compensating the secondary maxima and to be constructed with the lens elements each of which has a F-number determiend by taking into account the diameters of the second condenser lens and the fly's eye lenses assembly. In practice, it is impossible to interchange the assembly each time when one mask is replaced by another one having a slit width different from that of the former mask. But it is preferred to change the inclination angle of the rays. On this account, in the embodiment of the invention, there is provided the diaphragm device 14 which is controllable to optimize the maximum inclination angle. Because the operation of the diaphragm gives no adverse influence on the other optical parts, the entire system can be operated under very stable conditions. It will be understood from the foregoing description that the mask 16 is illuminated by rays with various inclination angles as shown in FIG. 1 to thereby remove the influence of diffraction on the image of the mask projected on the surface of the photoresist layer 17.

As the fly's eye lens assembly functions both as a beam divider and as a divergent lens for each split component flux, it becomes a diffusing plate such as ground glass or opal glass when the number of split component fluxes approaches infinite. However, the ground glass or opal glass generally has a far better divergence than the lens element, that is, it lacks directivity, so that the light amount of the light source must be increased to effect equivalent results. When a diffusing plate is employed instead of the fly's eye lens assembly in the apparatus of FIG. 2, it has to be disposed with its diffusing surface coinciding with the front focal point of the second condenser lens.

The construction and arrangement of the apparatus of FIG. 2 is further adapted for incorporation of optical means capable of compensating the standing wave. For facilitating the incorporation of the standing wave compensating means, the condenser lens system in the apparatus is divided into two parts, the first one of which provides a light flux of parallel rays directed to the fly's eye lens assembly, and the second one of which converges the light fluxes exiting from the assembly. The standing wave compensating means is removably inserted in the path of the light flux of parallel rays between the first and second parts of the condenser lens system.

Figure 6:
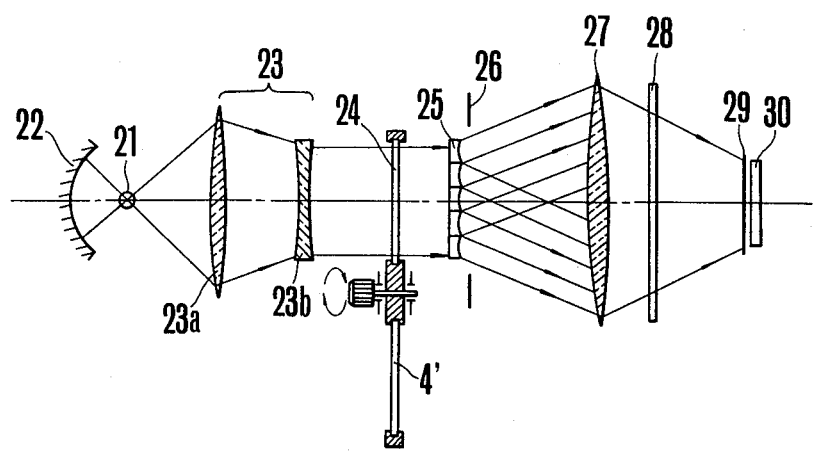
FIG. 6 is a schematic sectional view showing a specific example of the embodiment employing a filter for compensating the standing wave.

Referring now to FIG. 6, there is shown a specific example of the embodiment of the invention as including a light source 21, a concave mirror 22 facing the light source 21, a focal condenser lens 23 of positive power arranged on the side of the light source 21 opposite to mirror 22, this condenser lens being composed of a positive lens element 23a and a negative lens element 23b, a filter 24 for compensating the standing wave, and a multiple flux generating lens assembly 25 constructed in the form of a negative lenslet network such as a fly's eye lens assembly mentioned above. This multiple flux generating lenses assembly 25 may be otherwise constructed, for example, in the form of an optical fiber plate of which the fiber has the refractive index varying with radius, a diffusing plate, or a direction-selective diffusing element. The apparatus of FIG. 6 further includes a diaphragm device 26 positioned adjacent and in from of the assembly 25, a convergent optical system or a lens 27, an illumination compensating filter 28, a mask 29 carrying microscopic patterns and a wafer 30 having successively coated thereon a transparent layer and a photosensitive resist layer, all of these parts being arranged in coaxial alignment with the optical axis of the apparatus. A lamp of high brightness and capable of producing acute rays suited for a given photosensitive resist material is suitable as the light source 21. The mecury vapor lamp has found wide acceptance to utilize short wavelength rays such as the $g$ line, $h$ line, or $365m\mu$ line. The effective use of these rays is an important factor in designing the apparatus. In this respect, the mirror 22 also contributes an additional increase in the efficiency of the lamp to the apparatus by directing to the condenser lens 23 the rays which would not otherwise enter the condenser lens 23. Another factor in efficiently collecting the light emerging from the lamp is to decrease the F-number of the first condenser lens 23. The F-number itself is defined by the ratio of the focal length to the lens diameter. The diameter of the lens cannot be increase so much because of the limited bulk of the apparatus. Therefore, the embodiment of the invention employs as the first condenser lens group a lens having a decreased focal length as composed of a positive lens element and a negative lens element arranged in this order from the front with respect to the illumination light. Another advantage of such construction of the first condenser lens 23 is that the light source 21 radiates rays in all directions which are deflected in passing through the front positive lens element 23a to converge, and the converging rays from lens element 23a are made parallel to one another by the rear negative lens element 23b to thereby facilitate the arrangement and construction of the parts following the condenser lens 23. The position of the standing wave compensating filter 24 is not confined to that shown in FIG. 6, but arrangement of the filter 24 behind the first condenser lens 23 is advantageous in decreasing the diameter of the filter 24. This filter is removably inserted into the light flux and can be readily replaced by another filter 24' having different characteristics.

The action of the standing wave compensating filter will now be explained. In order to increase the resolving power of the photosensitive material such as photoresist which is widely used, it is necessary to decrease the thickness of the photosensitive layer applied on the wafer to as small a level as possible. The presently available coating technique using a spinner can apply a uniform coating of a thickness in the order of microns. On the other hand, the line widths of the pattern to be printed is also in the order of microns. Therefore, the accurate control of the thickness of the photoresist layer is very important in fabricating the integrated circuits. Further, it is to be noted that both the line widths of the pattern and the thickness of the photosensitive layer are in the order of microns, that is, they are near to the wavelengths of light. The I.C. printing operation requires in a sense a very high accuracy near to the margin of the performance of the optical system so that the minute defects in reproduction of the line widths must be taken into account. Such problems are encounted in each of the projecting, contact-printing and non-contact printing methods. As the common problem, mention may be made of the standing wave produced in the photoresist layer.

The substrate on which an I.C. pattern is transferred by printing is usually made of silicon or metal such as aluminum, so that the wave of light entering the photosensitive layer interferes with the wave of light reflected therefrom to form a standing wave. When the exposure of the photoresist is optimized for improvement of the resolving power by taking into account the presence of the standing wave, wrinkles are produced in the hardened portions of the developed and processed photoresist layer. When the exposure is increased to prevent the wrinkles from occurring, the resolving power has to be sacrificed to some extent because of the over-exposure. The formation of wrinkles is largely dependent upon the contrast of the image, so that this problems is avoidable in the contact-printing method which ensures high contrast, but becomes serious in the non-contact printing or lens projecting methods.

As stated above, the formation of the standing wave is caused by the reflection wave from the substrate on which the photoresist layer is applied. The standing wave has an energy distribution along the thickness of the photoresist layer. Such as energy distribution within the photoresist layer deteriorates the uniformity of the exposure in the direction along the thickness of the layer, whereby the hardening degree of the photosensitive layer varies with distance from the surface of the substrate to result in unsatisfactory image reproduction due to increased roughness of edges of the pattern and formation of wrinkles and, in extreme case, the peeling-off of the photoresist layer from the substrate.

Figure 7A:
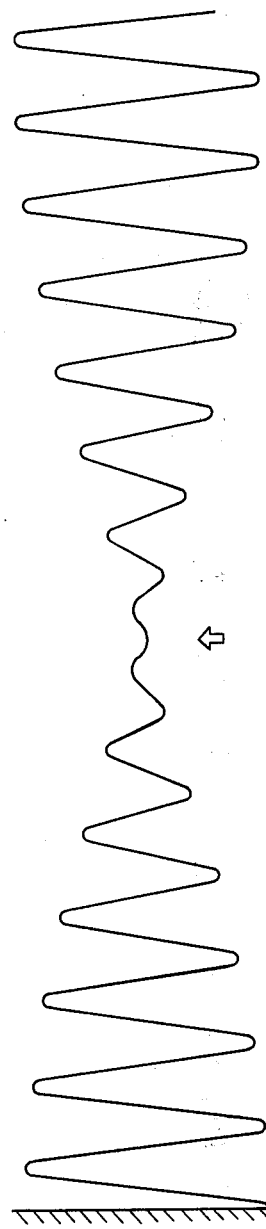
FIGS. 7A and 7B are schematic representations showing the effect of the filter for compensating the standing wave.
Figure 7B:
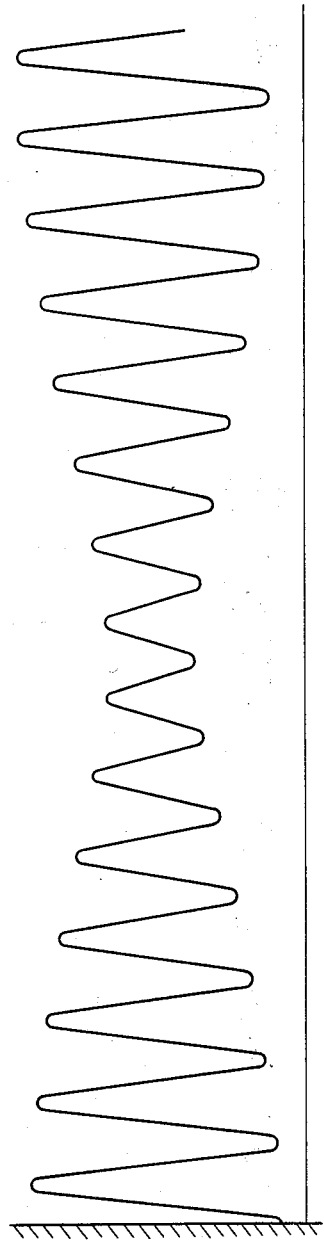

For minimizing the influence of the standing wave, it is effective to employ a multicolor lighth source capable of producing a plurality of different wavelength acute rays. In this case, a number of standing waves are produced for respective color lights which are incoherently superpositioned on one another to produce a beat with the result that the peaks and valleys of the standing waves tend to cancel each other out at a portion of the entire length along the thickness so that the resultant compound wave in this portion is considerably uniform in the direction along the thickness. Therefore, if a transparent layer is provided between the photosensitive layer and the substrate, the position of the photosensitive layer can be adjusted to occupy this portion by the thickness control of the transparent layer, whereby a uniform exposure is effected. In order to effectively remove the influence of the standing wave by use of a multicolor light source, it is further necessary to carry out a systematic evaluation of the spectral characteristics of the light source and the spectral sensitivity of the photosensitive material. For example, when an exposure is made by use of two lights of different wavelength, it is desirable that the influences of these two lights on the photosensitive layer are identical to each other as determined after the development. If so, the place in which the peaks and valleys of the standing waves cancel each other out is more preferable for the uniform exposure. However, the position of the place in which the cancelling occurs most effectively is dependent upon the reflection characteristics of the substrate, the thickness and refractive index of the intermediate transparent layer and the thickness and refractive index of the photosensitive layer. In order to secure the effective cancelling in this place, it is further necessary to control the intensity ratios or intensity distribution of the lights of different wavelength which are used in the exposure. This situation will be better understood by reference to FIGS. 7A and 7B, wherein FIG. 7A shows a resultant compound wave occurring when $g$-line and $h$-line have identical effects on the photoresist, and FIG. 7B shows a resultant compound wave occurring when $h$-line has an effect two times as large as that of the $g$-line. It will be appreciated that the conditions of FIG. 7A are more preferable for elimination of influence of the standing wave.

Figure 8:
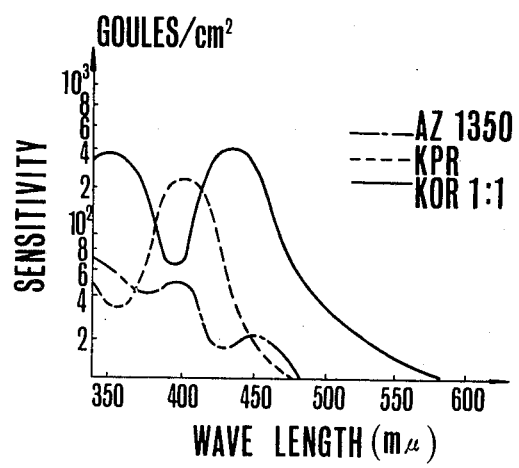
FIG. 8 shows the spectral characteristics of usually aviailable photoresists.

On the other hand, the process for fabricating IC devices is to superimpose a series of patterns by a succession of alignment and fabricating steps until the finished product is constructed. In this process, photoresists are used as the photosensitive material, whereby the number of photoresists used in a single run is not always limited to only one, but two or more photoresists may be used when a multiplicity of patterns of IC is produced on a wafer. When different photoresists are used as the photosensitive material, it is not required to change the optical system itself, but from the systematic standpoint of view, it is necessary to alter the spectral characteristics of the system. FIG. 8 shows spectral sensitivity curves of three photoresists. It is to be understood that the spectral characteristics of the system has to be largely varied in accordance with the shape of the spectral sensitivity curve of the used photoresist.

Figure 9:
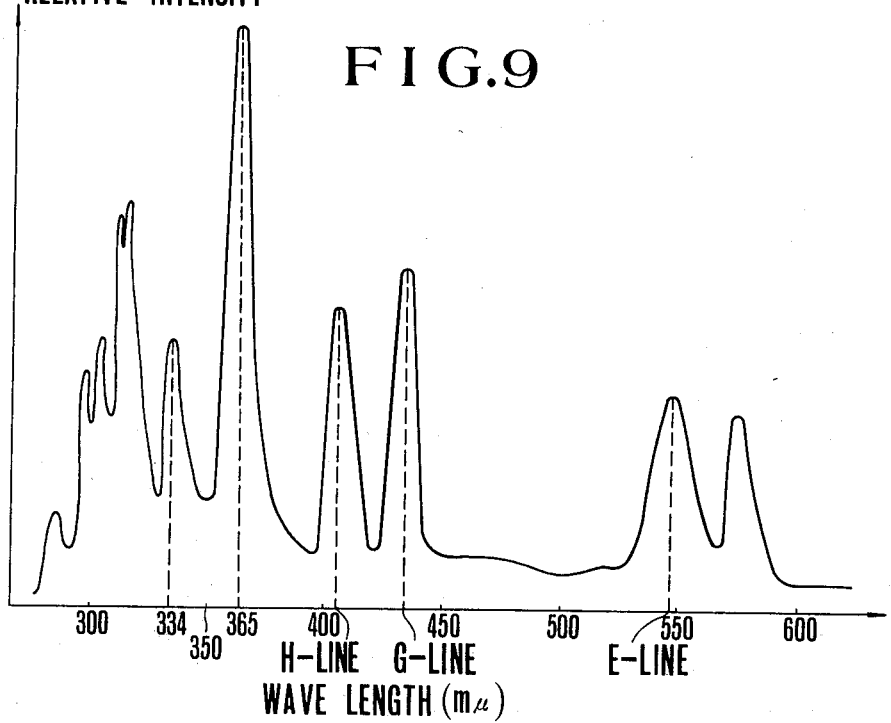
FIG. 9 is a spectrum of a usual mercury vapor lamp.
Figure 10:
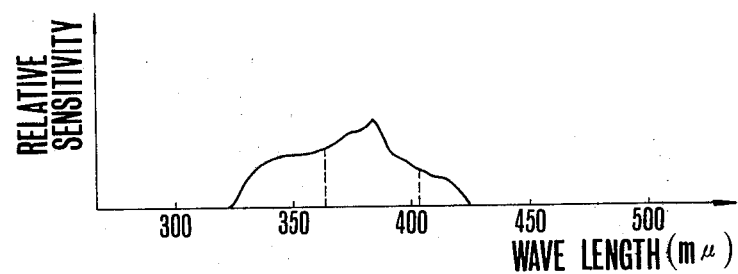
FIG. 10 shows a spectral sensitivity characteristic of an example of the photoresist.
Figure 11:
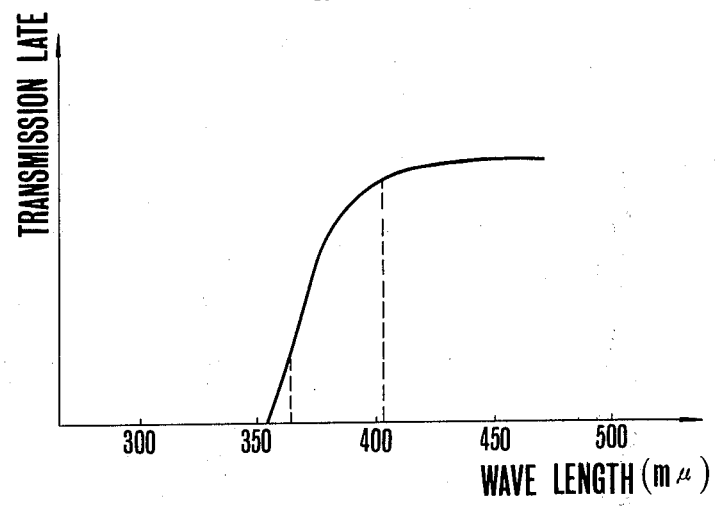
FIG. 11 is a transmittance characteristic of a standing wave compensating filter.

The actual printing optical system usually employs a color temperature-invariable light source which does not enable the system to embody different spectral characteristics for different photoresists. According to this invention, the control of the intensity ratio or intensity distribution of light rays available from the light source for the purpose of effectively compensating the standing wave is effected by interchanging the standing wave compensating filter in response to a change in the spectral characteristics of the photoresist. This will be described in more detail in connection with FIGS. 9, 10 and 11. FIG. 9 shows the spectrum of a mercury vapor lamp. This spectrum is characterized as having bright lines peculiar to mercury, namely, 365.01m$\mu$-line, the $h$-line (404.66m$\mu$), $g$-line (435.84m$\mu$) and $e$-line (546.07m$\mu$), for example. The intensities of the 365m$\mu$-line, $h$-line and $g$-line in the spectrum are so large that the intensities of the other lines may be neglected. For this reason, it may be said that the effective exposure is made with only these bright spectral lines. In printing microscopic patterns, the $g$-line and shorter wavelength lines than the $g$-line are frequently used, because of the blue sensitivity and good resolving power of the photoresist material. FIG. 10 shows an example of the spectral characteristics of a photoresist. Most of the presently-available photoresists are adapted to be sensitive to near-ultraviolet rays. This example of the photoresist in FIG. 10 is sensitive to rays having wavelengths longer than 430m$\mu$. Accordingly, the bright spectral lines substantially usable for the exposure of the photoresist are limited to three lines, namely, the $h$-line, 365m$\mu$-line and 334m$\mu$-line. Now assuming that two of these lines, namely, $h$-line and 365m$\mu$-line are used in an exposure, the influence of each actual spectral line on the photoresist may be estimated by a relation between the intensity of the respective spectral line. In the combination of a mercury vapor lamp of FIG. 9 and the photoresist of FIG. 10, both the spectral characteristics of the lamp and spectral sensitivity of the photoresist are larger at the 365m$\mu$-line than at the $h$-line, so that the standing wave is more susceptible to 365m$\mu$-line rays. In order to eliminate the influence of the standing wave, therefore, the apparatus of the invention employs a standing wave compensating filter having a transmittance characteristic as shown in FIG. 11 which compensates the spectral characteristics of the lamp so as to equalize the influences of the 365m$\mu$-line and the $h$-line to each other to effect optimum result.

In addition, the interchangeability of the standing wave compensating filter in the apparatus makes it possible to adjust the position of the relatively flat portion of the resultant compound wave in accordance with the position of the photosensitive layer relative to the substrate, when the design parameters for the intermediate transparent layer made of $SiO_2$, for example, located between the substrate and the photosensitive layer are previously given. For example, the first place in which the peaks and valleys of the standing waves with two lights of different wavelengths counting from the substrate approaches the substrate as the difference between the two wavelengths is increased. In the case of a smaller wavelength difference, the position of the first place is farther from the substrate, but the image of the first place is advantageously widened. Therefore, as the number of usable wavelengths increases, the possibility of minimizing the debasing influence of the standing wave is increased provided that a suitable combination of lights of different wavelength determined by taking into account the spectral sensitivity of the photoresist is selected by use of a corresponding filter and at the same time the intensity ratio of the lights is suitably controlled.

Figure 12:
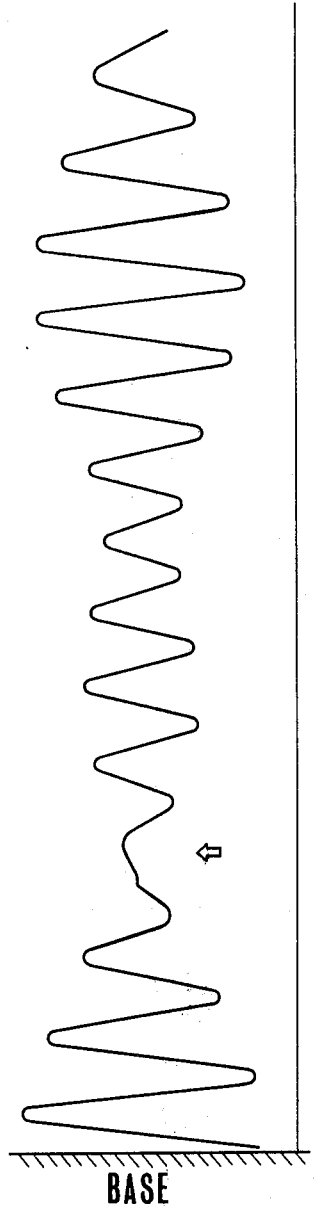
FIG. 12 shows another example of the effect of the standing wave compensating filter.

FIG. 12 shows a resultant compound wave occurring when the actions of the $g$-line, $h$-line and 365m$\mu$-line rays are balanced with one another, wherein the place in which the feature of the standing wave is minimized is nearer to the substrate as compared with those of FIGS. 7A and 7B. It is to be understood that the provision for compensating the standing wave made in the interchangeable filter of the apparatus of the invention gives a great advantage of increasing the percentage of finished products which will be found acceptable.

Figure 13:
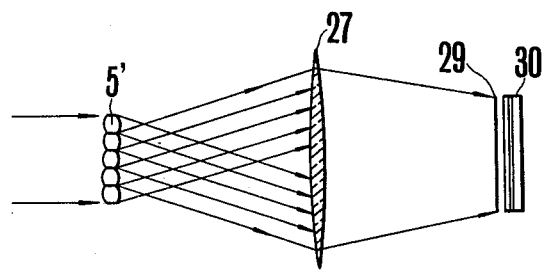
FIG. 13 is a fragmentary sectional view of the apparatus of the invention.

Referring again to FIG. 6, the multiple flux generating assembly 25 is positioned in front of the second condenser lens system 27 so that the exit rays from the assembly 25 impinge upon the condenser lens system 27 at incident angles uniformly distributed in a certain range. The standing wave compensating filter 24 and the multiple flux generating assembly 25 are designed to have respective diameters slightly larger than the diameter of the light flux exiting from the first condenser lens 23. The diaphragm device 26 positioned adjacent and behind the assembly 25 functions as a means for controlling the maximum angle of incidence of the rays impinging upon the mask 29. The second condenser lens system 27 is shown as comprising a single convex lens by which the many component fluxes generated by the assembly 25 are again collected to effectively illuminate the mask 29. It is required that the diameter of the lens 27 be large enough to secure a certain angle of incidence on the mask and to collect a large proportionn of the rays emanating from the assembly 25. For example, as shown in FIG. 13, the second condenser lens 27 collects the rays exiting from the fly's eye lens assembly 25 without vignetting, and permits the mask 29 to be positioned in the entrance pupil thereof. It is to be understood that a decrease in the diameter of the flux of parallel rays which is effected by the first condenser lens system 23 is advantageous in decreasing the effective aperture of the second condenser lens system 27.

Figure 14:
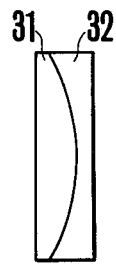
FIG. 14 is a schematic sectional view of a illumination compensating filter usuable in the apparatus of FIG. 13.

The photosensitive materials for use in printing microscopic patterns are usually photoresists. However, the photoresist layers are very susceptible to uneven illumination and, therefore, it is preferred to limit the unevenness to less than 5 percent. The avoidance of vignetting by the aforesaid arrangement is an important factor in providing uniform illumination. But, in the practical apparatus, a satisfactory uniform distribution of illumination light energy on the mask cannot be effected by only the avoidance of vignetting. On this account, the apparatus of the invention further employs an ND filter for compensating the uneven illumination on the mask. An example of the ND filter is shown in FIG. 14, in which a compound plate which functions as a ND filter is constructed from a plano-convex lens element 31 made of a material having a larger absorbance for rays to which the photoresist material is exposed and a plano-concave lens element 32 made of a material having a smaller absorbance arranged in mating relation to each other. In this case, different compensation functions can be imparted to the compound plate by using lens elements 31 and 32 having different axial thicknesses and radii of curvature. Another example of the ND filter is a transparent plate on which a metal such as aluminum or chrominum is evaporated so as to impart to the plate a continuous or discontinuous distribution of density.

It will be seen from the foregoing description that the present invention provides a light exposure apparatus of which the form and construction is suitable for incorporation of optical means for preventing obscurity at the edges of the pattern image and for compensating the standing wave in the photosensitive layer, and in which the actinic rays from the light source are permitted to pass through the photomask to the photosensitive layer in a manner such that a microscopic pattern can be effectively printed on the photosensitive layer.

What is claimed is:

1. A light exposure apparatus for printing comprising:
    a light source;
    a converging optical system arranged to substantially collimate the rays coming from said light source;
    a multiple flux generating assembly arranged in the path of a flux of rays exiting from said condenser lens system to form a great number of component fluxes while causing each of the component fluxes to spread;
    a collimating lens system disposed with its primary focal point substantially coinciding with a plane containing the origins of the component fluxes formed by said multiple flux generating assembly;
    a mask carrying a microscopic pattern constructed in the form of an array of light-permeable and light-impermeable regions; and
    mask supporting means supporting said mask above the surface on which an image of the mask is projected and spaced apart therefrom by a distance which is in the order of microns;
    whereby said collimating lens system collimates said component fluxes which illuminate said mask.

2. A light exposure apparatus for printing according to claim 1, further comprising:
    a light source of small luminous region;
    a condenser lens system for substantially collimating the rays coming from said light source;
    a lens array assembly constructed in the form of an array of a plurality of component lenses;
    a collimating lens system; and
    a mask carrying a pattern constructed in the form of an array of light-permeable and light-impermeable regions;
    the arrangement being such that the primary focal point of said collimating lens system substantially coincides with a plane containing the focal points of the component lens of said lenses array assembly, and the position of said mask is in almost coincidence with the entrance pupil of said collimating lens system;
    whereby said collimating lens system collimates said component fluxes which illuminate said mask.

3. A light exposure apparatus for printing according to claim 2, wherein said lens array assembly is constructed in the form of an array of a plurality of negative lenses disposed on a common plane with their optical axes being parallel to each other.

4. A light exposure apparatus for printing according to claim 2, wherein said lens array assembly is constructed in the form of an array of a plurality of positive lenses disposed on a common plane with their optical axes being parallel to each other.

5. A light exposure apparatus for printing according to claim 2, wherein said condenser lens system comprises a convergent lens group and a divergent lens group.

6. A light exposure apparatus for printing according to claim 1, further comprising aperture control means positioned adjacent said multiple flux generating assembly to vary the inclination angle of the rays impinging upon the mask.

7. A light exposure apparatus for printing according to claim 6, wherein said aperture control means is arranged on the exit side of said multiple flux generating assembly in close relation thereto.

8. A light exposure apparatus for printing according to claim 1, wherein said light source has a plurality of given wavelengths different from one another; and a member which comprises a substrate having coated thereon a photosensitive layer and a light-permeable layer arranged between the substrate and the photosensitive layer and having an index of refraction almost equal to that of the photosensitive layer and disposed with the exposed surface of the photosensitive layer coinciding with the plane on which the image of said mask is projected, and which apparatus further includes standing wave control means arranged between said condenser lens system and said multiple flux generating assembly to compensate the intensity ratios of the given wavelengths so that the actions of these wavelengths on the photosensitive layer are identical to one another.

9. A light exposure apparatus for printing according to claim 8, wherein said standing wave control means is an interference filter having given transmission characteristics.

10. A light exposure apparatus for printing according to claim 1, further comprising illumination compensating means arranged between said converging optical system and said mask to make uniform the illumination of the mask over the entire area of the mask.

11. A light exposure apparatus for printing according to claim 10, wherein said illumination compensating means is a filter of which the transmittance increases with radius.

12. A light exposure apparatus for printing according to claim 11, wherein said filter is constructed from a plano-convex lens and a plano-concave lens arranged in mating relation to each other, said plano-convex lens being made of a material having a larger absorbance for the mask illumination light, and said plano-concave lens being made of a material having a smaller absorbance for the mask illumination light.

13. A light exposure apparatus for printing according to claim 1, wherein said converging optical system comprises a concave mirror and lens means.

14. A light exposure apparatus for printing according to claim 1, wherein said multiple flux generating assembly is a light diffusing element.

15. A light exposure apparatus for printing according to claim 14, wherein said light diffusing element is an opal glass plate.

\* \* \* \* \*

UNITED STATES PATENT OFFICE
CERTIFICATE OF CORRECTION

Patent No. 3,988,066  Dated October 26, 1976

Inventor(s) Akiyoshi Suzuki et al.

It is certified that error appears in the above-identified patent and that said Letters Patent are hereby corrected as shown below:

On the cover sheet item [30] insert:

-- March 29, 1974     Japan     49-36141     --.

Signed and Sealed this

Fifth Day of April 1977

[SEAL]

Attest:

RUTH C. MASON
*Attesting Officer*

C. MARSHALL DANN
*Commissioner of Patents and Trademarks*